US005986590A

United States Patent [19]

Smith et al.

[11] Patent Number: 5,986,590

[45] Date of Patent: Nov. 16, 1999

[54] ANTENNA SYSTEM

[75] Inventors: Irl W. Smith, Concord; L. E. André Brunel, North Grafton, both of Mass.

[73] Assignee: Raytheon Company, Lexington, Mass.

[21] Appl. No.: 08/943,860

[22] Filed: Oct. 3, 1997

Related U.S. Application Data

[62] Division of application No. 08/649,385, May 17, 1996.

[51] Int. Cl.[6] ....... H03M 5/12

[52] U.S. Cl. ....... 341/70

[58] Field of Search ....... 341/68, 69, 70, 341/71, 72

[56] References Cited

U.S. PATENT DOCUMENTS

| | | | |
|---|---|---|---|
| 3,820,031 | 6/1974 | Smithlin | 341/70 |
| 4,603,322 | 7/1986 | Blair | 341/70 |
| 5,471,462 | 11/1995 | Amador | 341/70 |

OTHER PUBLICATIONS

1995 IEEE MTT–S Digest, André Brunel, et al., Demonstration of Photonically–Controlled GAAS Digital/MMIC for RF Optical Links, pp. 1283 –1285.

Reference Data for Radio Engineers 5th Edition, ITT, Digital Computers, Sections 32–21 and 32–22.

First Annual DARPA/RADC Symposium on Photonics Systems for Antenna Applications, Dec. 13–14, 1990, Monteray, CA, C. P. McClay, et al., Microwave Optical Integrated Circuit for Phased Array Antennas.

IEEE Transactions on Microwave Theory and Techniques vol. 38, No. 5, May 1990, Peter J. Heim, et al., Frequency Division Multiplex Microwave and Baseband Digital Optical Fiber Link for Phased Array Antennas, pp. 494–500.

IEEE Photonics Technology Letters, vol. 4, No. 7, Jul. 1992, Y. Akahori, et al., 10–Gb/s High–Speed Monolithically Integrated Photoreceiver Using InGaAs p–i–n PD and Planar Doped InA1As/InGaAs HEMT's, pp. 754–756.

IEEE Photonics Technology Letters, vol. 7, No.2, Feb. 1995, L. M. Lunardi, et al., A 12–Gb/s High Performance, High–Sensitivity Monolithic p–i–n/HBT Photoreceiver Module for Long–Wavelength Transmission Systems, pp. 182–184.

IEEE Photonics Technology Letters, vol. 3, No. 6, Jun. 1991, N. Uchida, et al., A 622 Mb/s High–Sensitivity Monolithic InGaAs–InP pin–FET Receiver OEIC Employing a Cascode Preamplifier, pp. 540–542.

IEEE Photonics Technology Letters, vol. 7, No. 6, Jun. 1995, Y. Muramoto, et al., High–Speed Monolithic Receiver OEIC Consisting of a Waveguide p–i–n Photodiode and HEMT's, pp. 685–687.

*Primary Examiner*—Howard L. Williams
*Attorney, Agent, or Firm*—Fish & Richardson P.C.

[57] ABSTRACT

A phased array antenna system having an array of antenna elements coupled to radio frequency energy feed network through a plurality of phase shifter sections with digital control data being fed to the phase shifter sections with radio frequency energy signal modulated with the digital control data. A modulator is fed by the source of the radio frequency energy and a modulating signal to produce the modulated radio frequency energy signal. A modulating signal generator/encoder, fed by the digital control data, encodes each bit of such digital control data into the modulating signal, such modulating signal being a bipolar signal having a pair of electrical signal changes corresponding to a binary state represented by such bit. The modulated radio frequency energy signal may be fed to the demodulator through the radio frequency feed network or through the antenna element coupled thereto. The demodulator section produces a demodulated bipolar signal corresponding to the bipolar modulating signal and decodes the demodulated bipolar signal into a binary signal having logic states corresponding to the binary states represented by the encoded bits of the bipolar modulating signal. An output section is fed by the detector and decoder section for converting the binary signal produced by the detector and decoder section into the digital words for the phase shifter section. The digital control data includes a strobe signal. The plurality of phase shifter sections act to properly configure themselves to radio frequency energy passing therethrough in accordance with control words addressed thereto in response to detection of the strobe signal.

14 Claims, 8 Drawing Sheets

ANTENNA SYSTEM

This application is a divisional of application Ser. No. 08/649,385 filed May 17, 1996.

BACKGROUND OF THE INVENTION

This invention relates generally to antenna systems and more particularly to phased array antenna systems.

As is known in the art, phased array antenna systems are adapted to produce a beam of radio frequency energy (RF) and direct such beam along a selected direction by controlling the phase of the energy passing between a transmitter/receiver and an array of antenna elements through a plurality of phase shifter sections. This direction is provided by sending a control word (i.e., data representative of the desired phase shift, as well as attenuation and other control data such as a strobe signal) to each of the phase shifter sections. Such control word has been sent to the phase shifter sections through electrical wires or opto-electronics (i.e., fiber optics).

SUMMARY OF THE INVENTION

In accordance with the present invention, a phased array antenna system is provided having an array of antenna elements coupled to radio frequency energy feed network through a plurality of phase shifter sections with digital control data being fed to the phase shifter sections with a radio frequency energy signal modulated with the digital control data.

With such an arrangement, neither electrical wires or opto-electronics is required.

In a preferred embodiment of the invention, the system includes a modulator section, fed by a source of radio frequency energy and the digital control data, for modulating the radio frequency energy in accordance with the digital control data to produce a modulated radio frequency energy signal for the plurality of phase shifter sections. Each one of the phase shifter sections includes a radio frequency energy controller for controlling an electrical characteristic of radio frequency energy passing therethrough between a corresponding one of the plurality of antenna elements and the radio frequency energy feed network. The electrical characteristic (i.e., phase shift, attenuation, for example), along with other devices in the phase shifter section, such as transmit/receive (T/R) switches, are controlled in accordance with digital words fed to such one of the phase shifter sections. Each one of the phase shifter sections also includes a demodulator section, for demodulating the modulated radio frequency energy signal to produce the digital words for such radio frequency energy controller.

In one embodiment, the modulated radio frequency energy signal is fed to the demodulator through the radio frequency feed network and in another embodiment the modulated radio frequency energy is fed to the demodulator through the antenna element coupled thereto.

In accordance with another feature of the invention, the modulator section, includes: a modulator fed by the source of the radio frequency energy and a modulating signal to produce the modulated radio frequency energy signal; and, a modulating signal generator/encoder, fed by the digital control data, for encoding each bit of such digital control data into the modulating signal. The modulating signal is a bipolar signal having a pair of electrical signal changes corresponding to a binary state represented by such bit. More particularly, the modulating signal generator/encoder includes circuitry for encoding each bit of the digital control data into a bipolar modulating signal. The bipolar modulating signal has a positive voltage pulse followed by a negative voltage pulse in representing one binary state of the bit and has a negative voltage pulse followed by a positive voltage pulse in representing the other binary state of the bit. The demodulator section includes: a detector and decoder section, fed by the modulated radio frequency energy signal, for producing a demodulated bipolar signal corresponding to the bipolar modulating signal and for decoding the demodulated bipolar signal into a serial binary signal having logic states corresponding to the binary states represented by the encoded bits of the bipolar modulating signal; and an output section fed by the detector and decoder section for converting the serial binary signal produced by the detector and decoder section into the digital words for the phase shifter section.

With such an arrangement, each encoded bit has the same average voltage and also allows for self-clocking at the phase shifter section.

In accordance with still another feature of the invention, the digital control data includes a strobe signal and the plurality of phase shifter sections act to properly configure themselves to radio frequency energy passing therethrough in accordance with control words addressed thereto in response to detection of the strobe signal fed to the plurality of phase shifter sections.

BRIEF DESCRIPTION OF THE DRAWING

Other features of the invention, as well as the invention itself, will become more readily apparent from the following detailed description of the invention when read together with the accompanying drawings, in which.

DESCRIPTION OF THE PREFERRED EMBODIMENTS

Figure 1:
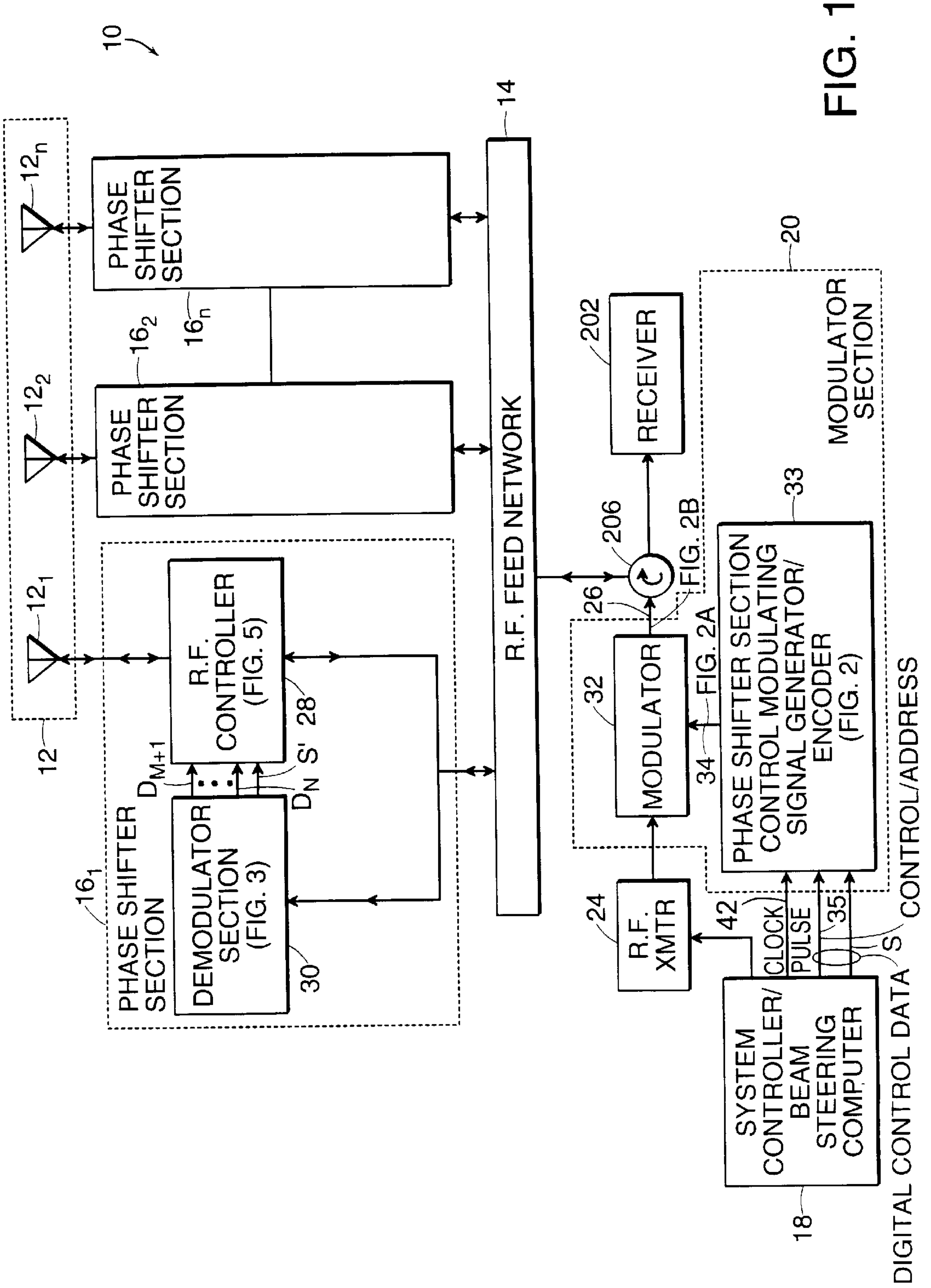
FIG. 1 is a block diagram of a phased array antenna system according to the invention.

Referring now to FIG. 1, a phased array antenna system 10 is shown having an array 12 of antenna elements $\mathbf{12}_1$–$\mathbf{12}_n$ coupled to radio frequency energy feed network 14 through a plurality of phase shifter sections $16_1$–$16_n$, respectively, as shown, such system 10 directing a beam of radiation in accordance with digital control data produced by a system controller/beam steering computer 18. The digital control data represents: (1) electrical characteristics to be imparted to RF energy passing through the phase shifter sections $16_1$–$16_n$ between the antenna elements $12_1$–$12_n$ respectively, and the RF feed network 14 (i.e., phase shift, attenuation, for example); (2) address data for the phase shifters $16_1$–$16_n$; and, (3) a strobe bit for the phase shifters $16_1$–$16_n$. One feed network 14 adapted for use herein is described in copending patent application entitled "Phased Array Antenna", inventors Edward A. Geyh, Robert P. Zagrodnick, and James E. Rhein, assigned to the same assignee as the present invention, filed May 17, 1996, the entire subject matter thereof being incorporated herein by reference.

More particularly, the phased array antenna system 10 includes: a modulator section 20, fed by a source of radio frequency energy, here an RF transmitter 24, and the digital control data produced by a system controller/beam steering computer 18, for modulating the radio frequency energy in accordance with the digital control data to produce a modulated radio frequency energy signal on line 26 (FIG. 2B) for the plurality of phase shifter sections $16_1$–$16_n$.

Each one of such plurality of phase shifter sections $16_1$–$16_n$ is identical in construction (except for the address thereof), an exemplary one thereof, here phase shifter section $16_1$ being shown in detail to include: a radio frequency energy controller 28 for controlling the electrical characteristic (i.e., phase shift, attenuation, for example) of radio frequency energy passing therethrough between a corresponding one of the plurality of antenna elements $12_1$–$12_n$, here antenna element $12_1$, and the radio frequency energy feed network 14. The address for the phase shifters $16_1$–$16_n$ is provided by bits $D_0$–$D_M$ of an N+1 bit digital word $D_0$–$D_N$, and control data for controlling the electrical characteristic (i.e., phase shift, attenuation, for example) as well as control for other devices such as transmit/receive (T/R) switches in the phase shifter sections $16_1$–$16_N$ is provided by bits $D_{M+1}$–$D_n$. A strobe signal, S, is also included in the digital control data fed to the phase shifter sections $16_1$–$16_n$. A demodulator section 30 is provided for demodulating the modulated radio frequency energy signal to produce the digital words (i.e., bits $D_0$–$D_N$) as well as the strobe signal, S, for such radio frequency energy controller 28. The strobe signal, S, strobes the control portion of the digital words (i.e., bits $D_{M+1}$–$D_N$) into a logic network (i.e., a logic network 162 to be described in more detail in connection with FIG. 5.) of the RF controllers 28 in the one of the phase shifters $16_1$–$16_n$ addressed by the address portion of the digital control word (i.e., bits $D_0$–$D_M$).

More particularly, the modulator section 20, includes: a modulator 32 fed by the source 24 of the radio frequency energy and a modulating signal on line 34 (FIG. 2A) to produce the modulated radio frequency energy signal on line 26 (FIG. 2B); and a phase shifter section modulating signal generator/encoder 33 (FIG. 2), fed by the digital control data (i.e., the control address portion on bus 35 and the strobe signal, S, produced by system controller/beam steering computer 18), for encoding each bit of such digital control data into the modulating signal on line 34. The modulating signal on line 34 has a pair of electrical signal changes corresponding to a binary state represented by each bit of the digital control data. More particularly, the modulating signal generator/encoder 33 includes circuitry, to be described in more detail in connection with FIG. 2, for encoding each bit of the digital control data, into a bipolar modulating signal, such bipolar modulating signal having a positive voltage pulse (+V) followed by a negative voltage pulse (−V) in representing one binary state of the bit (here, a logic 1 state) and having the negative voltage pulse (−V) followed by the positive voltage pulse (+V) in representing the other binary state of the bit (i.e., the logic 0 state). Thus, here the average voltage level of the bipolar signal representing each bit of the digital control data and strobe signal, S, has a zero volt level (i.e., a zero dc level), as shown in FIG. 2A.

Figure 2:
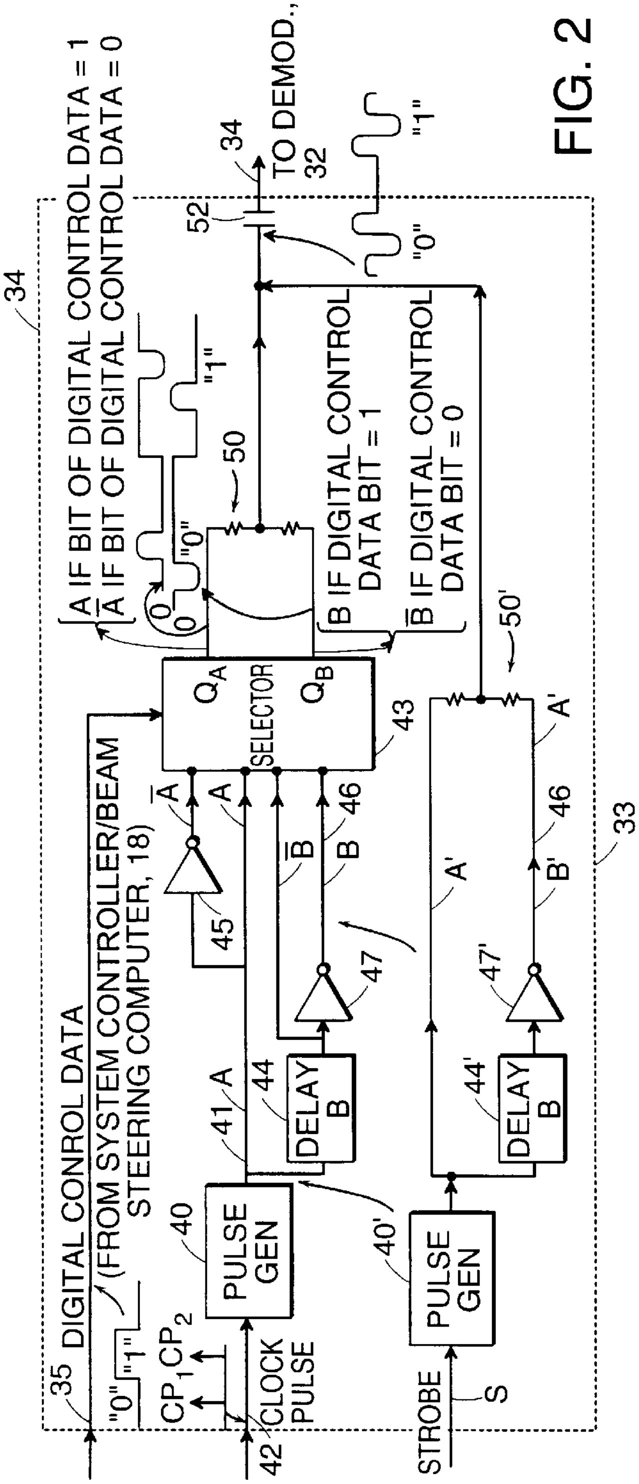
FIG. 2 is a block diagram of a phase shifter section control modulating signal generator/encoder used in the phased array antenna system of FIG. 1.
Figure 2A:
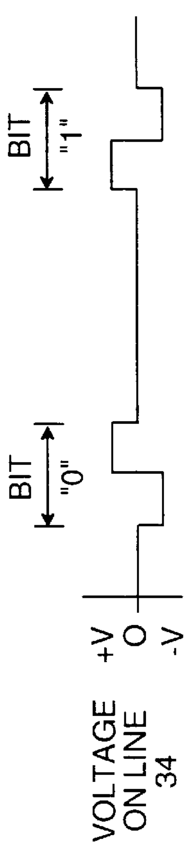
FIG. 2A is a timing history of a bipolar modulating signal used by the phase shifter section control modulating signal generator/encoder of FIG. 2 to encode logic states of digital control data to be fed to phase shifter sections of the phased array antenna system of FIG. 1.
Figure 2B:
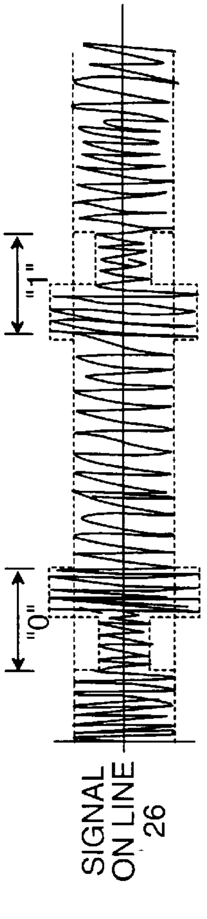
FIG. 2B is a timing history of a radio frequency energy signal modulated by the bipolar modulating signal of FIG. 2B and produced by the phase shifter section control modulating signal generator/encoder of FIG. 2.
Figures 2C, 2D, 2E, 2F, 2G, 2H, 2I, 2J, 2K:
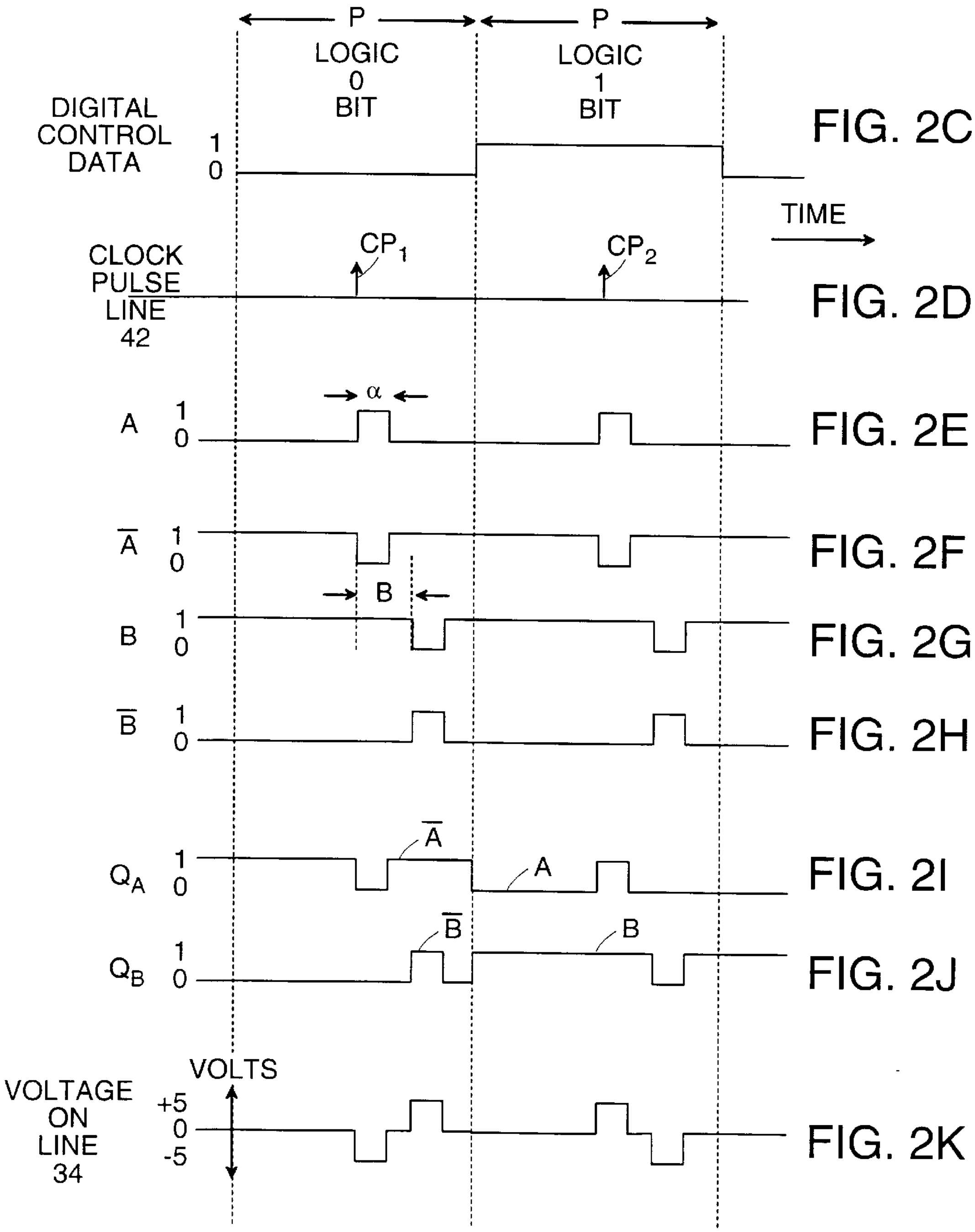
FIGS. 2C–2K are timing histories of signals fed to or generated by the phase shifter section control modulating signal generator/encoder of FIG. 2.

Referring now to FIG. 2, modulating signal generator/encoder 33 includes a pulse generator 40 for producing a pulse (A), FIG. 2E, of predetermined time duration, α, on line 41 in response to each clock pulse (FIG. 2D) produced by system controller/beam steering computer 18 on line 42. Line 41 is fed directly to selector 43, to such selector 43 after passing through inverter 45 to produce the complement of A, i.e, $\overline{A}$ (FIG. 2F), and to a delay 44, as shown. The output of delay 44 is fed to an inverter 47, such inverter 47 producing a pulse B (FIG. 2G) on line 46. Delay 44 provides an output pulse in response to an input pulse after a predetermined time delay, β. Thus, in response to each clock pulse on line 42, the logic level on line 41 changes, here from a logic 0 to a logic 1 for the time duration, α, and, after the predetermined time duration, β, the logic level on line 46 changes from a logic 1 to a logic 0 for the time duration, α, as indicated in FIG. 2. Thus, the complement of pulse B, i.e., $\overline{B}$ (FIG. 2H), is produced at the output of delay 44. The output of delay 44 and inverter 47 are also fed to selector 43. Selector 43 has a pair of outputs, $Q_A$ (FIG. 2I) and $Q_B$ (FIG. 2J), as shown. Also fed to the selector 43 is the digital control data from the system controller/beam steering computer 18. Each bit of the digital control data (FIG. 2C) is produced during a clock pulse on line 42. Thus, as shown, for example, in FIG. 2C, a logic 0 bit at clock pulse, $cp_1$ (FIG. 2D), is followed by a logic 1 bit at clock pulse, $cp_2$. It is noted that each bit has a bit duration or period, P, as shown in FIG. 2C. Selector 43 produces pulse A (FIG. 2E) at output $Q_A$ (FIG. 2I) if the digital control data bit (FIG. 2C) is a logic 1 and produces $\overline{A}$ (FIG. 2F) if the digital control data bit is a logic 0. Selector 43 produces at output $Q_B$ pulse B (FIG. 2G) if the digital control data bit is a logic 1 and produces $\overline{B}$ (FIG. 2H) if the digital control data is logic 0. Thus, for example, if the bits of the digital control data are 0 followed by 1, as shown in FIG. 2C: (1) for a bit of logic 0, output $Q_A$ produces A while output $Q_B$ produces B, as shown in FIGS. 2I and 2J, respectively; and (2) for bit of logic 1, $Q_A$ produces A while output $Q_B$ produces B, as shown in FIGS. 2I and 2J.

The outputs at $Q_A$, $Q_B$ are summed in resistor network 50 and then ac coupled through capacitor 52 to line 34. Thus, in the example described above in connection with FIG. 2C, the resulting bipolar voltage is shown in FIG. 2K. It is again noted that the modulating signal on line 34 has a pair of electrical signal changes corresponding to a binary state represented by each bit of the digital control data. More particularly, each bit of the digital control data is encoded as a bipolar modulating signal on line 34, such bipolar modulating signal having a positive voltage pulse (+5 V) followed by a negative voltage pulse (−5 V) in representing one binary state of the bit (here, a logic 1 state) and having the negative voltage pulse (−5 V) followed by the positive voltage pulse (+5 V) in representing the other binary state of the bit (i.e., the logic 0 state). Further, it is noted that the average voltage level of the bipolar signal representing each bit of the digital control data is the same and here such average voltages level is a zero volt level (i.e., a zero dc level) because of capacitor 52, as shown in FIGS. 2A and 2K.

The modulating signal generator/encoder 33 also includes a pulse generator 40' for producing a pulse (A') of shorter time duration than α in response to each strobe signal, S, produced by system controller/beam steering computer 18. The output of pulse generator 40' is fed to one end of resistor network 50', as shown, and to the other end of the resistor network 50' through a delay 44' and inverter 47', as shown. The delay, γ, provided by delay 44' is shorter than the delay, β, provided by delay 44. The output of the resistor network 50' is connected to the output of resistor network 50, as shown. Thus, each strobe signal, S, is encoded into a pair of pulses, here first a positive pulse followed a short time, γ, later by a negative pulse. Thus, the strobe signal, S, is also encoded as a bit having a pair of pulses; i.e., a positive pulse followed by a negative pulse. It is noted however, that the bit period is much smaller than the bit period produced by resistor network 50 and therefore the frequency of the pulse pair representing the strobe signal is here higher than the frequency of the pulse pair used for the address and control portions of the digital control data. Thus, the lower frequency pulse pair bits representing address/control is at a lower frequency then the pulse pair bits representing the strobe. As will be described, the address/control data may therefore be separated from the strobe data since they have different frequencies.

Figure 3:
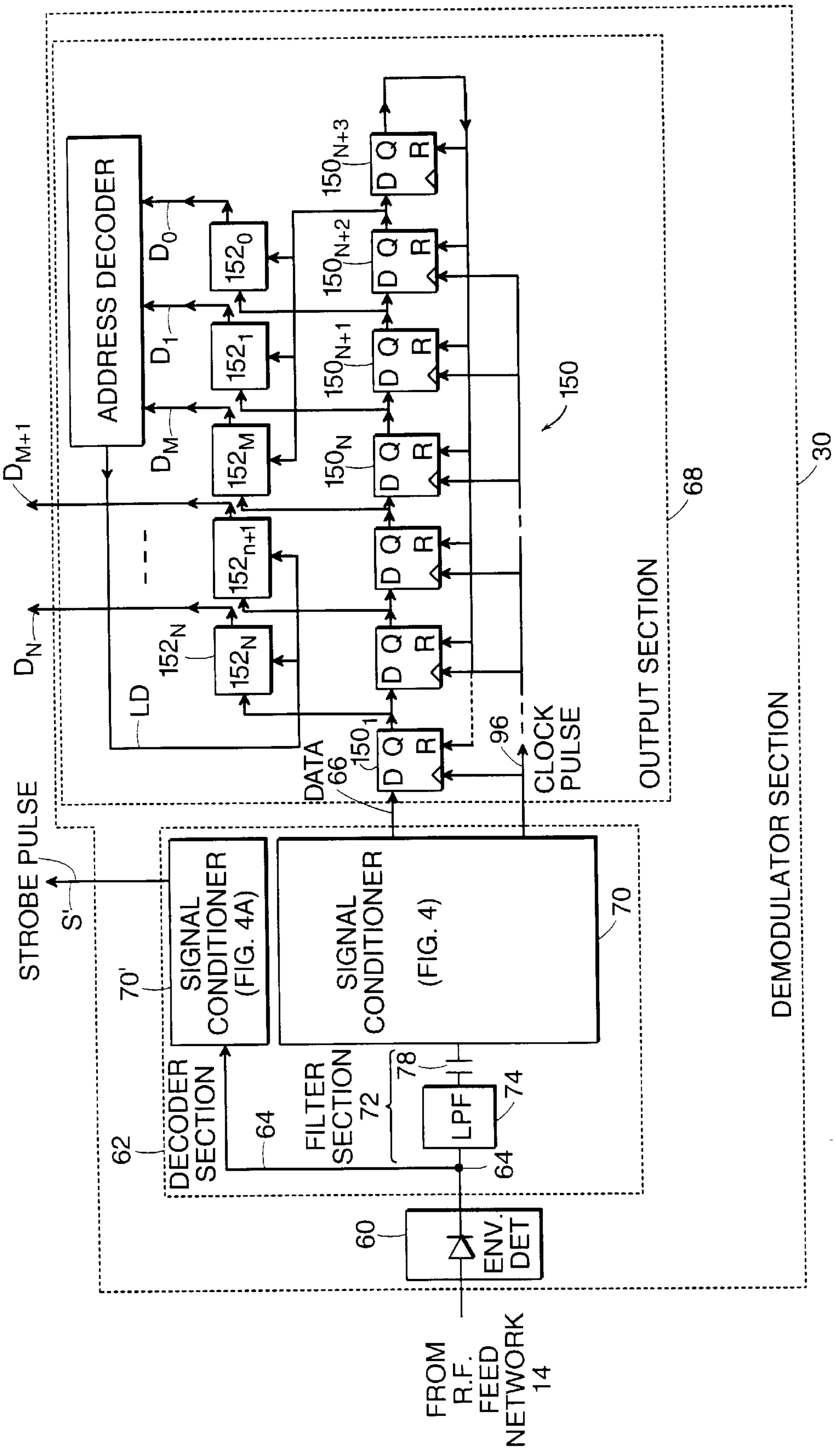
FIG. 3 is a block diagram of a demodulator included in the phase shifter sections of the phased array antenna system of FIG. 1.

Referring now to FIG. 3, the demodulator section 30 is shown to include an envelope detector 60 fed by the modulated radio frequency energy signal (FIG. 2B) from the RF feed network 14 (FIG. 1) and decoder section 62 fed by the output of the detector 60. The demodulator section 30 produces a demodulated bipolar signal on line 64 corresponding to the bipolar modulating signal on line 34 (FIGS. 1 and 2) and decodes the demodulated bipolar signal on line 64 into a serial binary signal (DATA) on line 66 having logic states corresponding to the binary states (i.e., a logic 1 for a positive-negative pulse pair or a logic 0 for a negative-positive pulse pair) represented by the encoded bits of the bipolar modulating signal (i.e., a serial data stream (DATA) on line 66 having logic states corresponding to the digital control data stream on line 35 (FIGS. 1 and 2). The demodulator section also includes an output section 68 fed by the decoder section 62 for converting the binary signal produced by the decoder section 62 on line 66 into the parallel digital words $D_0$–$D_N$.

More particularly, decoder section 62 includes a signal conditioner 70, to be described in more detail in connection with FIG. 4 coupled to detector 60 through a filter section 72, and a signal conditioner 70', to be described in connection with FIG. 4A. The signal conditioner 70 is coupled to detector 60 through a filter section 74. Here filter section 72 includes a lowpass filter 74 which feeds a capacitor 78, as shown. The lowpass filter 74 passes the lower frequency bit pairs associated with the address and control portions of the digital control data provided by the system controller/beam steering computer 18 (i.e., the data on bus 35) while rejecting the higher frequency bit pairs associated with the strobe signal on line, S. The signal conditioner 70', to be described in detail in connection with FIG. 4A, is coupled directly to the output of the detector 60 and produces the strobe pulse S' upon detection of an encoded strobe signal, S, pulse pair.

Figure 4:
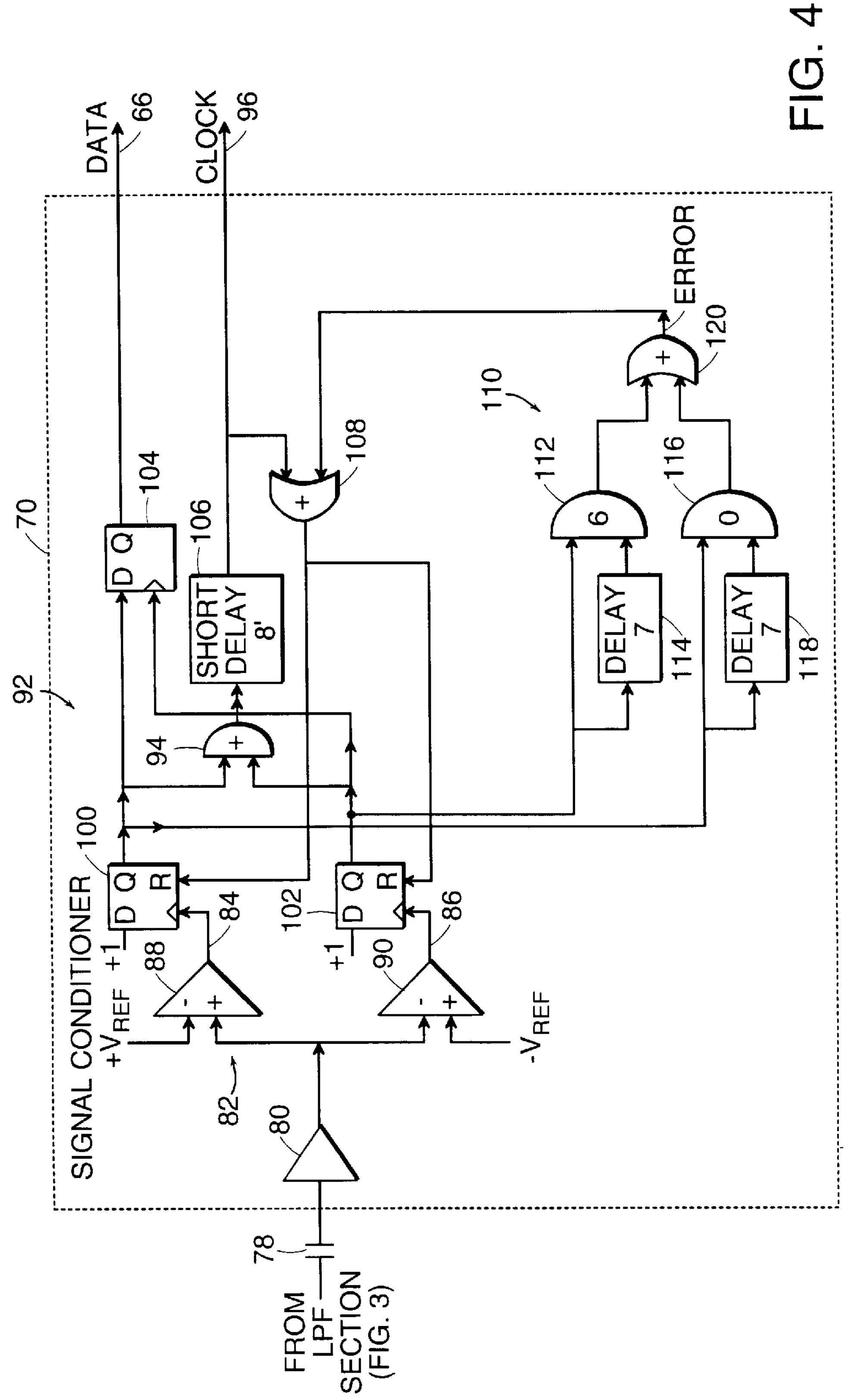
FIGS. 4 and 4A are block diagrams of signal conditioners used in the demodulator section of FIG. 3.
Figure 4A:
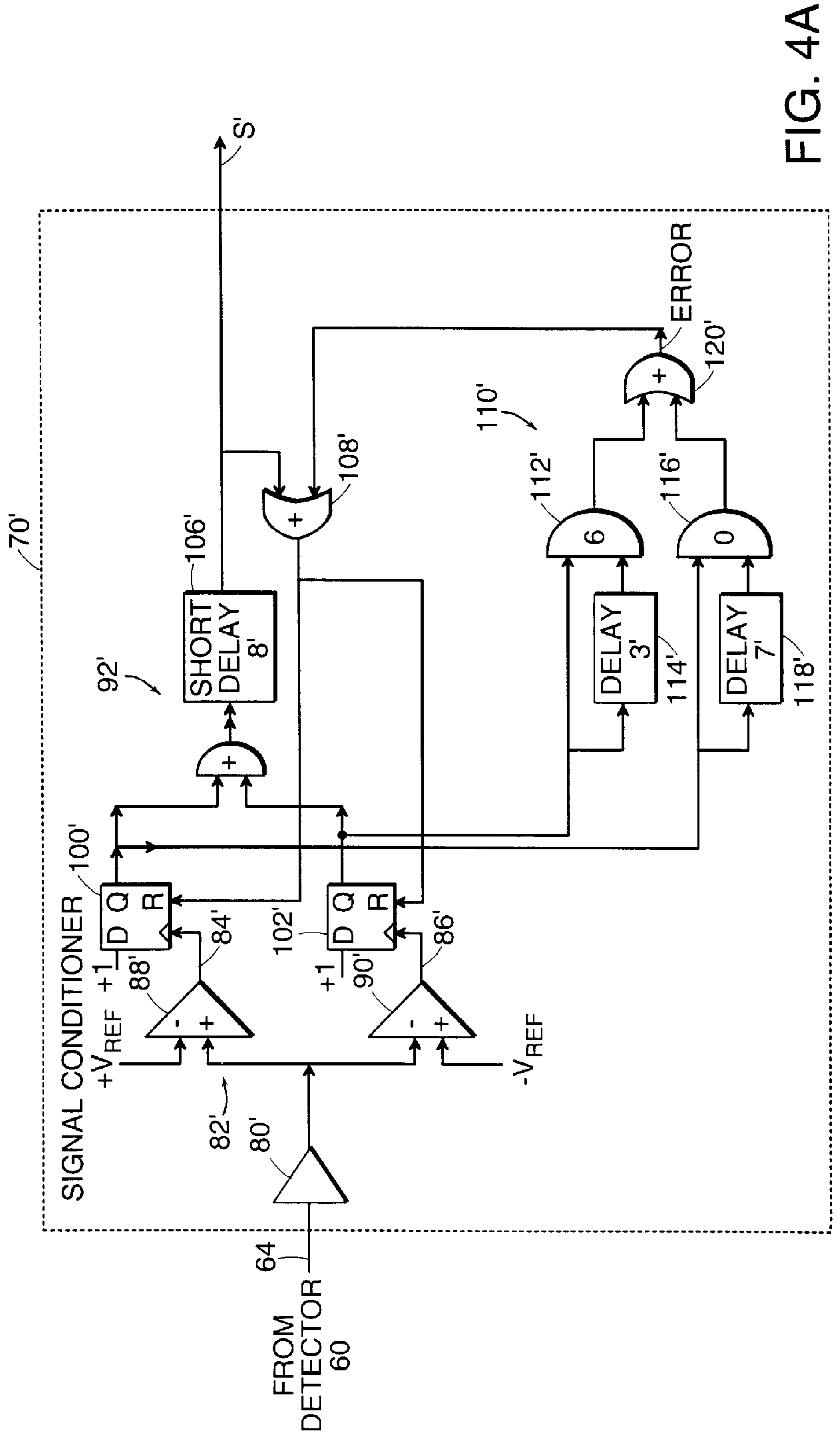

Referring now to FIG. 4, the signal conditioner 70 is shown to include a limiting amplifier 80 fed by the capacitor 78 and a comparator section 82 for producing unipolar pulses on a pair of outputs 84, 86 thereof in response to the ac coupled demodulated bipolar signal fed to amplifier 90. The comparator section 82 produces, in response to one binary state of the bit represented by such demodulated bipolar signal, a pulse on a first one of the pair of outputs 84, 86 followed by a pulse on a second one of the pair of outputs 84, 86 and produces, in response to the other binary state of the bit represented by such demodulated bipolar signal, a pulse on the second one of the pair of outputs 84, 86 followed by a pulse on the first one of the pair of outputs 84, 86. More particularly, comparator section 82 includes a pair of comparators 88, 90 having the non-inverting (+) and inverting (−) inputs thereof, respectively, fed by the output of amplifier 80, as shown. The inverting input (−) of comparator 88 is coupled to a positive reference voltage (+VREF) and the non-inverting input (+) of comparator 90 is coupled to a negative reference voltage (−VREF), as shown. Thus, comparator section 82 produces, in response to a logic 1 binary state of the bit represented by such demodulated bipolar signal, a positive pulse on output 84 followed by a positive pulse on output 86 and produces, in response to a logic 0 binary state of the bit represented by such demodulated bipolar signal, a positive pulse on output 86 followed by a positive pulse on the output 84.

A logic state signal producing circuit 92 is provided. Such logic state signal producing circuit 92 includes three D flip-flops 100, 102, 104 arranged as shown. Flip-flops 100, 102 have a logic 1 fed to the D inputs thereof. The output 84 is fed to the clock input of flip-flop 100 and the output 86 is fed to the clock input of flip-flop 102. Thus, a logic 1 is stored in flip-flop 100 when output 84 produces a positive pulse and a logic 1 is stored in flip-flop 102 when output 86 produces a positive pulse. It is noted that each binary bit will result in the outputs 84, 86 producing a sequence of positive pulses. The Q outputs of flip-flops 100, 102 are fed to the D input and clock input, respectively, of D flip-flop 104. Thus, D flip-flop 104 produces on line 66 a binary signal with a first logic state, here logic 1, when a positive pulse is produced on output 84 followed by a positive pulse being produced on output 86 and produces on line 66 a second logic state, here logic 0, when a positive pulse is produced on output 86 followed by a positive pulse on output 86.

The signal conditioner 70 also includes a clock pulse generation circuit 94, here an AND gate. Thus, it is again noted that each binary bit will result in the outputs 84, 86 producing a sequence of positive pulses. Therefore, after two positive pulses have latched logic 1 signals into flip-flops 100 and 102, a logic 1 signal is produced by delay 106 on line 96. If, however, a pair of positive pulses is not received within a predetermined time interval, τ, chosen to be longer than β (FIG. 2G) but shorter than the bit period, P (FIG. 2C), an error circuit 110, to be described, resets D flip flops 100, 102. Thus, each valid (i.e., non-error producing) bit of the serial data appearing on line 66 is accompanied by (i.e., identified by) a clock pulse on line 96.

The flip-flops 100, 102 are reset to a logic 0 state by delay 106 and OR gate 108. Thus, a short time, δ, (i.e., much less than a bit period, P) provided by delay 106, after a logic 1 is produced by AND gate 94, the logic 1 is fed to the reset terminals of flip-flops 100, 102 to reset their states to logic 0. An error detector 110 is provided to reset the flip-flops 100, 102 in the event that there is an excess delay between the pair of positive pulses making up a single bit. More particularly, the Q output of flip-flop 102 is fed directly to one input of AND gate 112 and to the other input through a delay 114, as shown. Also, the Q output of flip-flop 100 is fed directly to one input of AND gate 116 and to the other input through a delay 118, as shown. The output of AND gates 112, 116 are fed to OR gate 108 via OR gate 120. Here, delay 114 provides a delay, τ, where τ, as discussed above, is chosen to be longer than β (FIG. 2G) but shorter than the bit period, P (FIG. 2C). Thus, if a pair of positive pulses for a bit are produced within a period τ, the output of both AND gates 112 and 116 will be logic 0. However, if there is only one of the pair of positive pulses with the bit period, P, one of the two D flip-flops 100, 102 will not be reset by the short delay δ and one of the AND gates will produce a logic 1 indicating an error. Thus, OR gate 120 will produce a logic 1 and reset the D flip-flops 100, 102. Further, because both D flip-flops will not be set if there is an error, a clock pulse will not be produced on line 96. It is noted, therefore, that each bit pulse pair results in a logic state and a clock pulse thereby providing a self-clocking system.

Referring now to FIG. 4A, signal conditioner 70' is shown. The signal conditioner is similar to the signal conditioner 70 (FIG. 4) except that it is fed directly by the output of the detector 60 and does not produce control/address data but merely produces the strobe pulse, S', similar to the clock pulse produced by signal conditioner 70 on line 89. Thus, elements used in signal conditioner 70 which are equivalent to those in signal conditioner 70' are designated in conditioner 70' with a prime ('). Thus, conditioner 70' includes a limiting amplifier 80' fed by the detector 60 and a comparator section 82' for producing unipolar pulses on a pair of outputs 84', 86' thereof in response to the bipolar signal fed to amplifier 90'. The comparator section 82' produces, in response to one binary state of the bit represented by such demodulated bipolar signal, a pulse on a first one of the pair of outputs 84', 86' followed by a pulse on a second one of the pair of outputs 84', 86' and produces, in response to the other binary state of the bit represented by such demodulated bipolar signal, a pulse on the second one of the pair of outputs 84', 86' followed by a pulse on the first one of the pair of outputs 84', 86'. More particularly, comparator section 82' includes a pair of comparators 88', 90' having the non-inverting (+) and inverting (−) inputs thereof, respectively, fed by the output of amplifier 80', as shown. The inverting input (−) of comparator 88' is coupled to a positive reference voltage (+VREF) and the non-inverting input (+) of comparator 90' is coupled to a negative reference voltage (−VREF), as shown. Thus, comparator section 82' produces, in response to a logic 1 binary state of the bit represented by such demodulated bipolar signal, a positive pulse on output 84' followed by a positive pulse on output 86' and produces, in response to a logic 0 binary state of the bit represented by such demodulated bipolar signal, a positive pulse on output 86' followed by a positive pulse on the output 84'.

A logic state signal producing circuit 92' is provided. Such logic state signal producing circuit 92' includes two D flip-flops 100', 102' arranged as shown. Flip-flops 100', 102' have a logic 1 fed to the D inputs thereof. The output 84' is fed to the clock input of flip-flop 100' and the output 86' is fed to the clock input of flip-flop 102'. Thus, a logic 1 is stored in flip-flop 100' when output 84' produces a positive pulse and a logic 1 is stored in flip-flop 102' when output 86' produces a positive pulse. It is noted that each binary bit will result in the outputs 84', 86' producing a sequence of positive pulses. The signal conditioner 70' includes a strobe pulse generation circuit 94', here an AND gate. Thus, it is again noted that each binary bit will result in the outputs 84', 86' producing a sequence of positive pulses. Therefore, after two positive pulses have latched logic 1 signals into flip-flops 100' and 102', a strobe pulse, S', is produced by delay 106'. If, however, a pair of positive pulses is not received within a predetermined time interval, τ', chosen to be longer than β' but shorter than the bit period, P', for the higher-frequency bit pulse pair, an error circuit 110', to be described, resets D flip flops 100', 102'.

The flip-flops 100', 102' are reset to a logic 0 state by delay 106' and OR gate 108'. Thus, a short time, δ', (i.e., much less than the higher-frequency bit pulse pair period, P') provided by delay 106', after a logic 1 is produced by AND gate 94, the logic 1 is fed to the reset terminals of flip-flops 100', 102' to reset their states to logic 0. An error detector 110' is provided to reset the flip-flops 100', 102' in the event that there is an excess delay between the pair of positive pulses making up a single bit. More particularly, the Q output of flip-flop 102' is fed directly to one input of AND gate 112' and to the other input through a delay 114', as shown. Also, the Q output of flip-flop 100' is fed directly to one input of AND gate 116' and to the other input through a delay 118', as shown. The outputs of AND gates 112', 116' are fed to OR gate 108' via OR gate 120'. Here, delay 114' provides a delay, τ', where τ', is chosen to be longer than β' but shorter than the higher-frequency bit pulse pair bit period, P'. Thus, if a pair of positive pulses for a bit are produced within a period τ', the output of both AND gates 112' and 116' will be logic 0. However, if there is only one of the pair of positive pulses with the higher-frequency bit pulse pair period, P', one of the two D flip-flops 100', 102' will not be reset by the short delay δ and one of the AND gates will produce a logic 1 indicating an error. Thus, OR gate 120' will produce a logic 1 and reset the D flip-flops 100', 102'. Further, because both D flip-flops will not be set if there is an error, a strobe pulse, S,' will not be produced.

Figure 5:
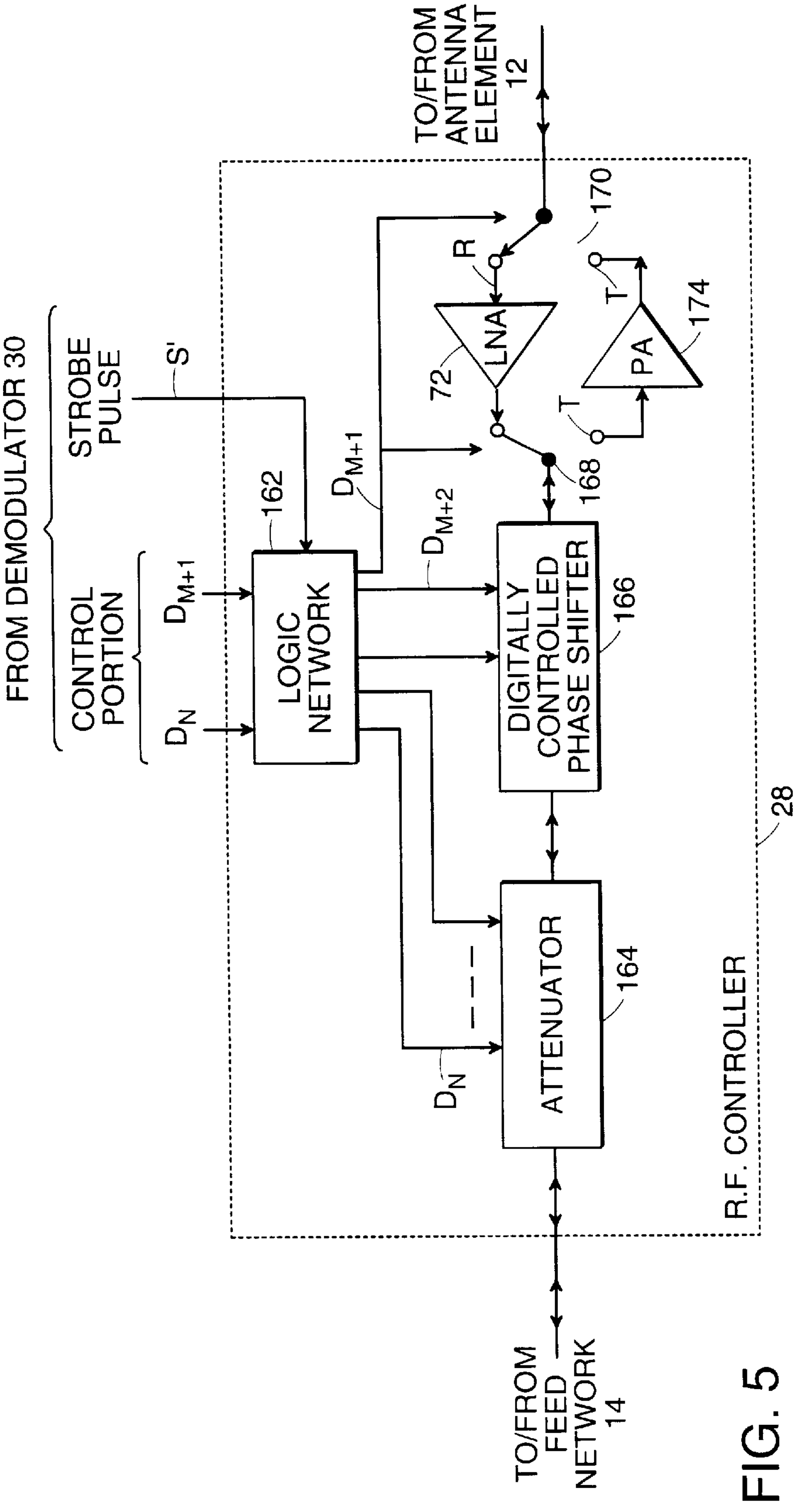
FIG. 5 is a block diagram of an R.F. energy controller used in the phase shifter sections of the phased array antenna system of FIG. 1.

It is noted that the time delay, τ', should be shorter than the bit delay time, β, of the lower-frequency control bits. Therefore, when the lower-frequency digital control pulse pair bit stream is applied to decoder 70', each pulse of such lower-frequency pulse pair will be detected but the error detection circuitry 110' will indicate an error and suppress the generation of a strobe pulse, S', on line 96'. Referring again to FIG. 3, the demodulator 30 includes, as noted above, an output section 68. The output section 68 is fed by the serial binary signal on line 66 and the clock pulses on line 96 for producing the digital words, $D_0$–$D_N$, for the radio frequency energy controller 28 (FIGS. 1 and 5). The output section 68 includes a shift register 150 for storing binary signals generated by the serial binary signals on line 66 in response to clock pulses produced by the clock pulse on line 96. Here, each digital word starts with a logic 1 and has a predetermined number of bits, here N+1 bits. The shift register 150 has N+3 serially coupled flip-flops $\mathbf{150}_1$–$\mathbf{150}_{N+3}$. Flip-flops $\mathbf{150}_1$–$\mathbf{150}_{N+1}$ store the N+1 bits of each digital word, flip-flop $\mathbf{150}_{N+2}$, serves as a "load" register and flip-flop $\mathbf{150}_{N+3}$ serves as a "clear" register. During an initialization mode, all flip-flops $\mathbf{150}_1$–$\mathbf{150}_{N+3}$ are initially reset to logic 0 by initially sending a series of N+3 logic 0 state signals to the phase shifter sections $\mathbf{16}_1$–$\mathbf{16}_n$. During the normal operating mode, (i.e., a mode subsequent to the initialization mode), normal operational digital control data can be sent to the phase shifter sections $\mathbf{16}_1$–$\mathbf{16}_n$ (FIG. 1). After the (N+2)th clock pulse of the control data on line 96 during the normal operating mode, the logic 1 which precedes the N+1 bit digital word appears at the Q output of flip-flop $\mathbf{150}_{N+2}$ and clocks, in parallel, the address portion, bits $D_0$ through $D_M$ of the digital word into a set of M+1 registers $\mathbf{152}_0$–$\mathbf{152}_M$. If the address portion of the digital word is proper for the demodulator section (i.e, each one of the phase shifter sections $\mathbf{16}_1$–$\mathbf{16}_n$ having a different address), a load data, LD, pulse causes registers $\mathbf{152}_{M+1}$–$\mathbf{152}_N$ to store the control data portion, (i.e, bits $D_{M+1}$–$D_N$). In response to the next clock pulse on line 96, the logic 1 in flip-flop $\mathbf{150}_{N+2}$ is stored in flip-flop $\mathbf{150}_{N+3}$ and is fed to the reset terminals of flip-flops $\mathbf{150}_1$–$\mathbf{150}_{N+3}$ to reset all N+3 flip-flops $\mathbf{150}_1$–$\mathbf{150}_{N+3}$.

Referring now to FIG. 5, the RF controller 28 is shown to include logic network 162, attenuator 164, phase shifter 166, T/R switches 168, 170, power amplifier 174, and low noise amplifier 174, arranged as shown. In response to the strobe pulse, S', the logic network 162 enables the control portion of the digital word, i.e., bits $D_{M+1}$–$D_N$ to pass to the attenuator 164, phase shifter 166, and T/R switches 168, 170. Thus, it is noted that since the strobe signal is sent to all phase shifter section $16_1$–$16_n$, all such phase shifter sections $16_1$–$16_n$ act to its own control portion, (i.e., bits $D_{M+1}$–$D_N$). To put it another way, each one of the phase shifter sections $16_1$–$16_n$ has a different address and will only accept digital control data on line 35 accompanying its unique address. The strobe signal does not have an accompanying address but rather is accepted by the plurality of phase shifter section $16_1$–$16_n$. To put it still another way, the digital control data includes a strobe signal and the plurality of phase shifter sections act to properly configure themselves for radio frequency energy passing therethrough in accordance with control words addressed thereto in response to detection of the strobe signal fed to the plurality of phase shifter sections.

Figure 6:
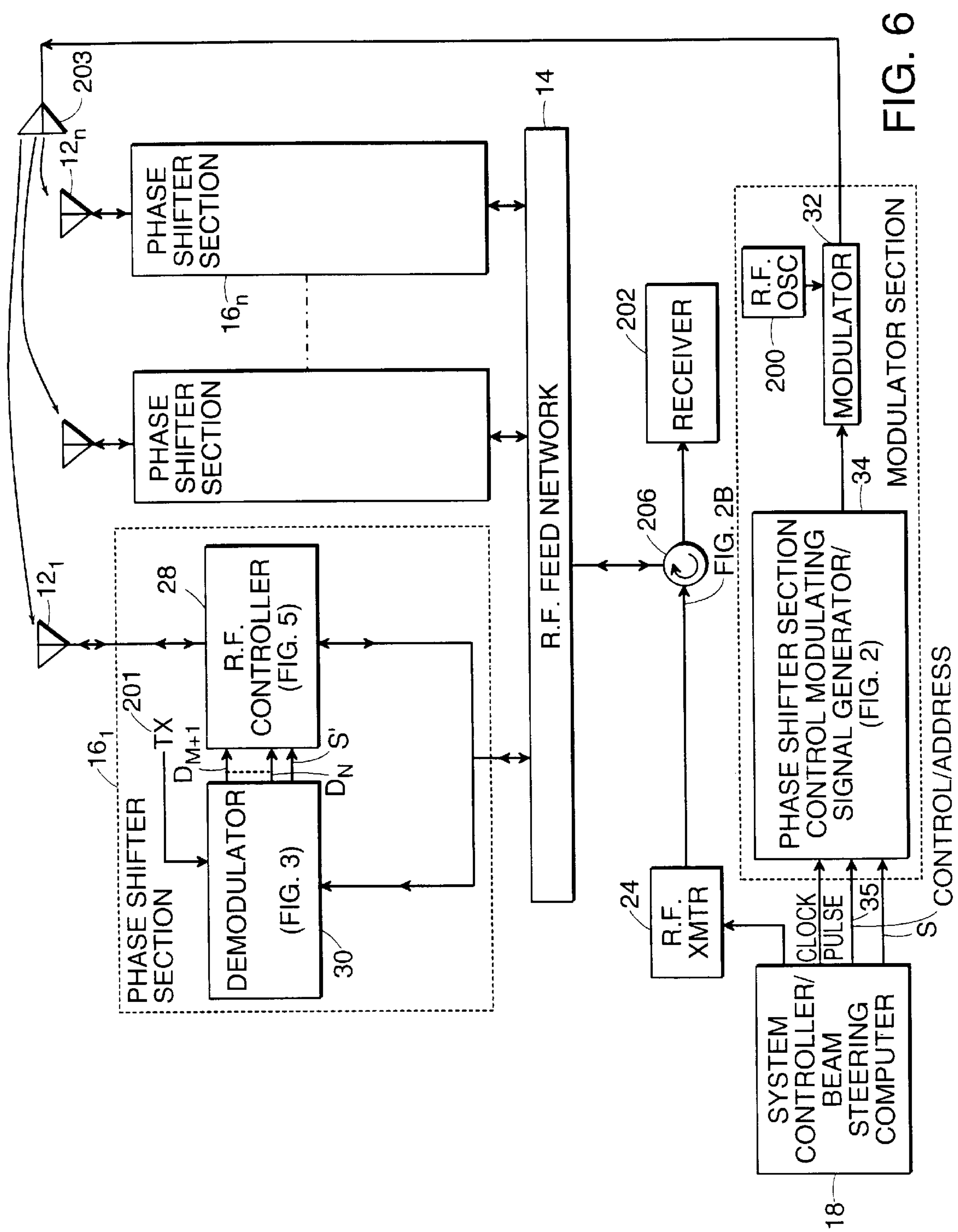
FIG. 6 is a block diagram of a phased array antenna system according to an alternative embodiment of the invention.

Referring now to FIG. 6 an alternative embodiment is shown. Here, phased array antenna system 10' has a separate RF source 200 fed to the modulator to produce the modulated RF energy signal. The RF modulated signal is then fed to an auxiliary antenna 203 for transmitting the modulated RF energy signal to the demodulator 30 via antenna elements $12_1$–$12_n$. A coupler 210 is used to couple a portion of the received RF energy to the demodulator 30.

It is noted that here a receiver 202 is coupled to the feed network 14 via a circulator 206. Further, the encoding-coding arrangement is adapted for implementation using gallium arsenide circuitry as described in a paper entitled “Demonstration of Photonically-Controlled GAAS Digital/MMIC for Optical Links” by Andre' Brunel, et al. published in the 1995 IEEE MTT-S Digest pages 1283–1285, the subject matter thereof being incorporated herein by reference.

Other embodiments are within the spirit and scope of the appended claims. For example, additional functions for the RF controller 28 may also be transmitted, such as polarization and time delay. Also, the digital control data and strobe pulse, S, may be sent to the phase shifter sections $16_1$–$16_n$ through the feed network 14 using a different radio frequency than that used for the radiated beam. In such case, instead of the output of the modulator 32 in FIG. 6 being coupled to an auxiliary antenna 203, the output of the modulator 32 and the output of the RF transmitter 24 in FIG. 6 would both be coupled to the input of a frequency-band diplexer and the output of the diplexer would be coupled to the input of the circulator 206. Further, each phase shifter section $16_1$–$16_n$ would be coupled to the feed network 14 though second frequency-band diplexers; one output of the second diplexers being coupled to the demodulator 30 and the other output of the second diplexers being coupled to the RF controller 28.

What is claimed is:

1. A binary signal encoder, comprising:

a source of binary signals; and an encoder fed by the source of binary signals for encoding each bit of the binary signals into a bipolar pulse pair and with each of the encoded bits having the same average voltage level, the pulse pair having a level which changes from the average voltage level to a first voltage level, then from the first voltage level to a second voltage level, then from the second level back to the average voltage level and wherein the encoder produces the average voltage level between each successive pair of encoded bits.

2. The encoder recited in claim 1 wherein the encoder includes circuitry for encoding one binary state of the encoded bit into a positive voltage pulse relative to the average voltage level followed by a negative voltage pulse relative to the average voltage level and another binary state of the encoded bit into a negative voltage pulse relative to the average voltage level followed by a positive voltage pulse relative to the average voltage level.

3. A binary signal encoder/decoder, comprising:

a source of binary signals;

an encoder fed by the source of binary signals for encoding each bit of the binary signals into a bipolar pulse pair and with each of the encoded bits having the same average voltage level, the pulse pair having a level which chances from the average voltage level to a first voltage level, then from the first voltage level to a second voltage level, then from the second level back to the average voltage level and wherein the encoder produces the average voltage level between each successive pair of encoded bits; and a decoder, fed by the encoded bits, for decoding the encoded bits into a binary signal having logic states corresponding to the binary states represented by the encoded bits.

4. The binary signal encoder/decoder recited in claim 3 wherein the decoder includes a signal conditioner comprising:

a comparator section for producing unipolar pulses on a pair of outputs thereof in response to the bipolar signal, such comparator section producing, in response to one binary state of the encoded bit, a pulse on a first one of the pair of outputs followed by a pulse on a second one of the pair of outputs and for producing, in response to the other binary state of the encoded bit, a pulse on the second one of the pair of outputs followed by a pulse on the first one of the pair of outputs; and a logic state signal producing circuit for producing the binary signal with a first logic state when a pulse is produced on the first one of the pair of outputs followed by a pulse on the second one of the pair of outputs and with a second logic state when a pulse is produced on the second one of the pair of outputs followed by a pulse on the first one of the pair of outputs.

5. The encoder/decoder recited in claim 4 wherein the signal conditioner includes a clock pulse generation circuit for producing a clock pulse in response to each decoded bit.

6. The encoder/decoder recited in claim 5 wherein the decoder includes an output section for converting the binary signal into the digital words.

7. The encoder/decoder recited in claim 6 wherein the output section is fed by the logic state signal and clock pulse generation circuits for producing the digital words.

8. The encoder/decoder recited in claim 7 wherein the output section includes a shift register for storing binary signals generated by the logic state producing circuit in response to clock pulses produced by the clock pulse generation circuit.

9. A method of encoding binary signals comprising the step of encoding each bit of the binary signals into a bipolar pulse pair and with each of the encoded bits and with each of the encoded bits having the same average voltage level, the pulse pair having a level which chances from the average voltage level to a first voltage level, then from the first voltage level to a second voltage level, then from the second level back to the average voltage level and wherein the average voltage level is produced between each successive pair of encoded bits.

10. The method recited in claim 9 wherein one binary state of the encoded bit has a positive voltage pulse relative to the average voltage level followed by a negative voltage pulse relative to the average voltage level and another binary state of the encoded bit has a negative voltage pulse relative to the average voltage level followed by a positive voltage pulse relative to the average voltage level.

11. A method for encoding and decoding binary signals, comprising the steps of:

encoding each bit of the binary signals into a bipolar pulse pair with each of the encoded bits having the same average voltage level, the pulse pair having a level which changes from the average voltage level to a first voltage level, then from the first voltage level to a second voltage level, then from the second level back to the average voltage level and wherein the average voltage level is produced between each successive pair of encoded bits; and decoding the encoded bits into a binary signal having logic states corresponding to the binary states represented by the encoded bits.

12. The method recited in claim 11 wherein one binary state of the encoded bit has a positive voltage pulse relative to the average voltage level followed by a negative voltage pulse relative to the average voltage level and another binary state of the encoded bit has a negative voltage pulse relative to the average voltage level followed by a positive voltage pulse relative to the average voltage level.

13. The method recited in claim 12 wherein the decoding step includes:

producing one binary state when the encoded bit has a positive voltage pulse relative to the average voltage level followed by a negative voltage pulse relative to the average voltage level and producing another binary state when the encoded bit has a negative voltage pulse relative to the average voltage level followed by a positive voltage pulse relative to the average voltage level.

14. The method recited in claim 13 including the step of producing a clock pulse in response to each decoded bit.

* * * * *